United States Patent
Tezuka

(10) Patent No.: US 10,910,695 B2
(45) Date of Patent: Feb. 2, 2021

(54) ON-CHIP ANTENNA

(71) Applicant: TDK CORPORATION, Tokyo (JP)

(72) Inventor: Masao Tezuka, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/559,730

(22) Filed: Sep. 4, 2019

(65) Prior Publication Data

US 2020/0091584 A1    Mar. 19, 2020

(30) Foreign Application Priority Data

Sep. 13, 2018  (JP) .................................. 2018-171546

(51) Int. Cl.
| | | |
|---|---|---|
| *H01Q 1/22* | (2006.01) | |
| *H01Q 23/00* | (2006.01) | |
| *H01L 23/522* | (2006.01) | |
| *H01Q 21/06* | (2006.01) | |
| *H01L 23/66* | (2006.01) | |

(52) U.S. Cl.
CPC ......... *H01Q 1/2283* (2013.01); *H01L 23/522* (2013.01); *H01Q 21/065* (2013.01); *H01Q 23/00* (2013.01); *H01L 23/66* (2013.01)

(58) Field of Classification Search
CPC ...... H01Q 1/22; H01Q 1/2283; H01Q 21/065; H01Q 23/00; H01Q 19/10; H01Q 19/104; H01L 23/522; H01L 23/66; H01L 2021/60022

See application file for complete search history.

(56) References Cited

U.S. PATENT DOCUMENTS

| | | | | |
|---|---|---|---|---|
| 2011/0187602 | A1* | 8/2011 | Nair ......................... | C03C 3/19 343/700 MS |
| 2013/0099006 | A1* | 4/2013 | Hong .................. | H01Q 1/2283 235/492 |
| 2014/0198013 | A1 | 7/2014 | Saraswat et al. | |
| 2017/0236776 | A1* | 8/2017 | Huynh ................ | H01L 23/3114 257/428 |
| 2018/0358685 | A1* | 12/2018 | Han ..................... | H01L 23/5389 |
| 2019/0067780 | A1* | 2/2019 | Kirino ..................... | H01P 5/087 |
| 2019/0096828 | A1* | 3/2019 | Wu ...................... | H01L 23/5384 |
| 2019/0305428 | A1* | 10/2019 | Hwang ............. | H01Q 21/0075 |

FOREIGN PATENT DOCUMENTS

| | | |
|---|---|---|
| JP | 2016-506675 A | 3/2016 |
| WO | 2014/110273 A1 | 7/2014 |

* cited by examiner

*Primary Examiner* — Thai Pham
(74) *Attorney, Agent, or Firm* — Oliff PLC

(57) ABSTRACT

An on-chip antenna includes an integrated circuit chip, a reflective conductor, at least one first coupler, at least one patch antenna element, a connection, and at least one second coupler. The integrated circuit chip includes a semiconductor, has an active surface and a back surface opposed to each other, and has a semiconductor circuit. The reflective conductor is disposed above the back surface. The at least one first coupler is disposed between the back surface and the reflective conductor. The at least one patch antenna element is disposed above the reflective conductor. The connection couples the at least one patch antenna element and the at least one first coupler. The at least one second coupler is provided on the active surface to be electrically conductive to the semiconductor circuit, and is opposed to the at least one first coupler and in non-contact with the at least one first coupler.

8 Claims, 9 Drawing Sheets

ON-CHIP ANTENNA

CROSS REFERENCE TO RELATED APPLICATIONS

This application claims the benefit of Japanese Priority Patent Application No. 2018-171546 filed on Sep. 13, 2018, the entire contents of which are incorporated herein by reference.

BACKGROUND

The disclosure relates to an on-chip antenna having an integrated circuit chip and a patch antenna.

An on-chip antenna is proposed that has a configuration in which an integrated circuit chip, including a semiconductor, and a patch antenna are disposed in a perpendicular direction, and a high-frequency signal circuit provided on the integrated circuit chip and the patch antenna are coupled to each other through a through silicon via (TSV) that passes through the integrated circuit chip. Reference is made to Japanese Unexamined Patent Application Publication (Published Japanese Translation of PCT Application) No. 2016-506675, for example. In such an on-chip antenna, electric power is supplied from the high-frequency signal circuit to the patch antenna through the through silicon via.

SUMMARY

An on-chip antenna according to an example embodiment of the disclosure includes an integrated circuit chip, a reflective conductor, at least one first coupler, at least one patch antenna element, a connection, and at least one second coupler. The integrated circuit chip includes a semiconductor, has an active surface and a back surface that are opposed to each other, and has a semiconductor circuit provided on the active surface. The reflective conductor is disposed above the back surface, where the active surface is directed downward and the back surface is directed upward. The at least one first coupler is disposed between the back surface and the reflective conductor. The at least one patch antenna element is disposed above the reflective conductor. The connection couples the at least one patch antenna element and the at least one first coupler. The at least one second coupler is provided on the active surface to be electrically conductive to the semiconductor circuit, and is opposed to the at least one first coupler and in non-contact with the at least one first coupler.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the disclosure.

DETAILED DESCRIPTION

Figure 1:
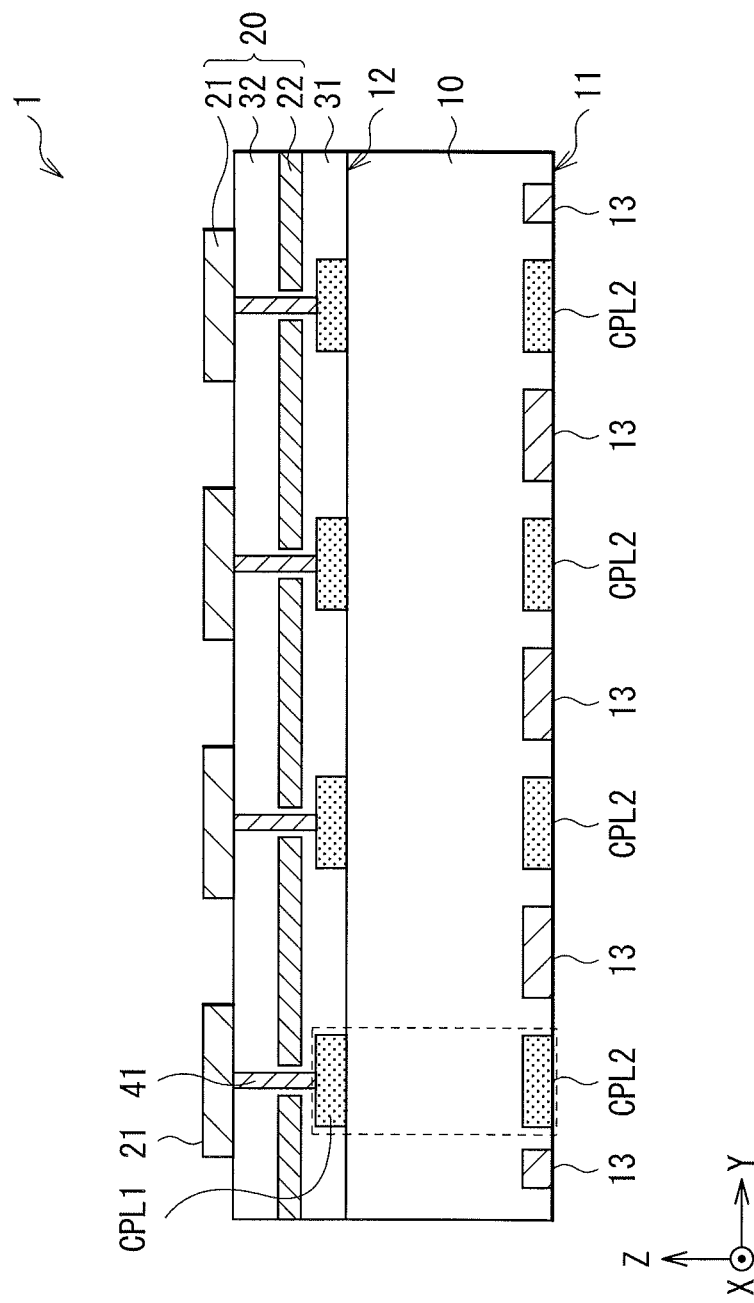
FIG. 1 is a cross-sectional view of a configuration example of an on-chip antenna according to one example embodiment.

Some embodiments of the disclosure are described below in detail with reference to the accompanying drawings.

It is to be noted that the following description is directed to illustrative examples of the technology and not to be construed as limiting to the technology. Factors including, without limitation, numerical values, shapes, materials, components, positions of the components, and how the components are coupled to each other are illustrative only and not to be construed as limiting to the technology. Further, elements in the following example embodiments which are not recited in a most-generic independent claim of the technology are optional and may be provided on an as-needed basis. The drawings are schematic and are not intended to be drawn to scale. It is to be noted that the like elements are denoted with the same reference numerals, and any redundant description thereof will not be described in detail. It is to be noted that the description is given in the following order.

0. Comparative Example
1. First Example Embodiment (FIGS. 1 to 7)
   1.1 Description of On-Chip Antenna according to First Example Embodiment
   1.2 Example of Coupling of On-Chip Antenna to Printed Circuit Board
   1.3 Modification Examples of First Example Embodiment
2. Second Example Embodiment (FIGS. 8 and 9)
   2.1 Description of On-Chip Antenna according to Second Example Embodiment
   2.2 Modification Examples of Second Example Embodiment With an increase in a frequency of a signal, a conductor loss increases due to the skin effect. In a case where a through silicon via is used for supplying electric power to a patch antenna (coupling between a high-frequency signal circuit and the patch antenna), an influence of a conductor loss attributed to the through silicon via increases as the frequency increases.

It is desirable to provide an on-chip antenna that makes it possible to suppress a conductor loss attributed to a through silicon via.

0. Comparative Example

In the fifth-generation mobile communication system (5G), selection of a band use in the international standard from a frequency band of 24.25 GHz to 86 GHz, which is higher than the existing frequency band, is being considered. One reason is to ensure a continuous wide bandwidth for wireless communication, and is an inevitable trend, because it aims at higher-speed data, multiple terminals, and low-delay communication. In addition, in Beyond 5G, i.e., the next-generation communication after 5G, this trend is expected to increase, and the use of the terahertz band is under consideration in the projects of the Ministry of Internal Affairs and Communications, Government of Japan.

On the other hand, it is known that the loss of a high-frequency signal increases as the frequency increases. In a case where a high frequency is used, it is desirable to shorten the line length as much as possible in order to prevent signal attenuation due to a transmission loss. By disposing a high-frequency signal circuit and an antenna section in the perpendicular direction rather than in the planar direction, a length of the line connecting the high-frequency signal circuit and the antenna section is shortened. At frequencies below 1 (one) mm, array antennas arranged at a pitch of half a wavelength is providable on an integrated circuit chip. Various techniques of such an on-chip antenna have been proposed from the viewpoint of miniaturization of a module. Reference is made to Japanese Unexamined Patent Application Publication (JP-A) No. 2016-506675, for example.

JP-A No. 2016-506675 proposes an on-chip antenna in which a high-frequency signal circuit, provided on an integrated circuit chip, and a patch antenna are coupled through a through silicon via. The electric power supply from the high-frequency signal circuit to the patch antenna is performed through the through silicon via. However, in a case where the through silicon via is used for the coupling between the high-frequency signal circuit and the patch antenna and for supplying electric power, the influence of a conductor loss attributed to the through silicon via increases as the frequency increases, due to the skin effect.

What is desired is a development of an on-chip antenna that makes it possible to suppress a conductor loss attributed to a through silicon via.

1. First Example Embodiment 1.1 Description of On-Chip Antenna According to First Example Embodiment

[Configuration Example of On-Chip Antenna]

FIG. 1 illustrates an example of a cross-sectional configuration of an on-chip antenna 1 according to a first example embodiment of the disclosure.

The on-chip antenna 1 includes an integrated circuit chip 10 that includes a semiconductor and that has an active surface 11 and a back surface 12. The active surface 11 and a back surface 12 are opposed to each other.

As illustrated in FIG. 1, a direction in which the active surface 11 and the back surface 12 of the integrated circuit chip 10 oppose each other is defined as a Z direction, and the two axes perpendicular to the Z direction and orthogonal to each other are defined as X and Y. FIG. 1 illustrates an example of a cross-sectional configuration of a plane parallel to the ZY plane. FIG. 1 illustrates a configuration in which the active surface 11 side of the integrated circuit chip 10 is directed downward and the back surface 12 side of the integrated circuit chip 10 is directed upward. The same applies to the following modified examples and other example embodiments.

In addition, the on-chip antenna 1 may include a first dielectric layer 31 provided above the back surface 12 of the integrated circuit chip 10, and a patch antenna layer 20 provided above the first dielectric layer 31.

The on-chip antenna 1 also includes a reflective conductor 22 disposed above the back surface 12 of the integrated circuit chip 10, and at least one first coupler CPL1 disposed between the back surface 12 and the reflective conductor 22. Further, the on-chip antenna 1 includes at least one patch antenna element 21 disposed above the reflective conductor 22, and a through via 41 that couples the patch antenna element 21 and the first coupler CPL1. In one embodiment of the disclosure, the through via 41 corresponds to a specific but non-limiting example of a "connection".

The on-chip antenna 1 may also include a second dielectric layer 32 disposed between the reflective conductor 22 and the patch antenna element 21.

The patch antenna layer 20 may include at least one patch antenna element 21, the reflective conductor 22, and the second dielectric layer 32.

The reflective conductor 22 and the patch antenna element 21 may operate as a patch antenna. The reflective conductor 22 may be, for example, a sheet-shaped conductor pattern provided between the first dielectric layer 31 and the second dielectric layer 32. The patch antenna element 21 may be, for example, a conductor pattern provided on an upper surface of the second dielectric layer 32. The reflective conductor 22 may be coupled to a ground potential or a predetermined reference potential.

Note that FIG. 1 illustrates a configuration example in which the patch antenna element 21 includes a plurality of patch antenna elements 21 and the first coupler CPL1 includes a plurality of first couplers CPL1. In one example embodiment, the number of the first couplers CPL1 and the number of the patch antenna elements 21 may be the same, for example. However, in an alternative example embodiment, it is also possible to take a configuration in which only one patch antenna element 21 and one first coupler CPL1 are included. The same applies to the following modified examples and other embodiments.

The first dielectric layer 31 may be disposed between the back surface 12 of the integrated circuit chip 10 and the reflective conductor 22. The through via 41 may pass through the first dielectric layer 31, the reflective conductor 22, and the second dielectric layer 32, and may couple one of the plurality of patch antenna elements 21 and corresponding one of the plurality of first couplers CPL1.

Figure 2:
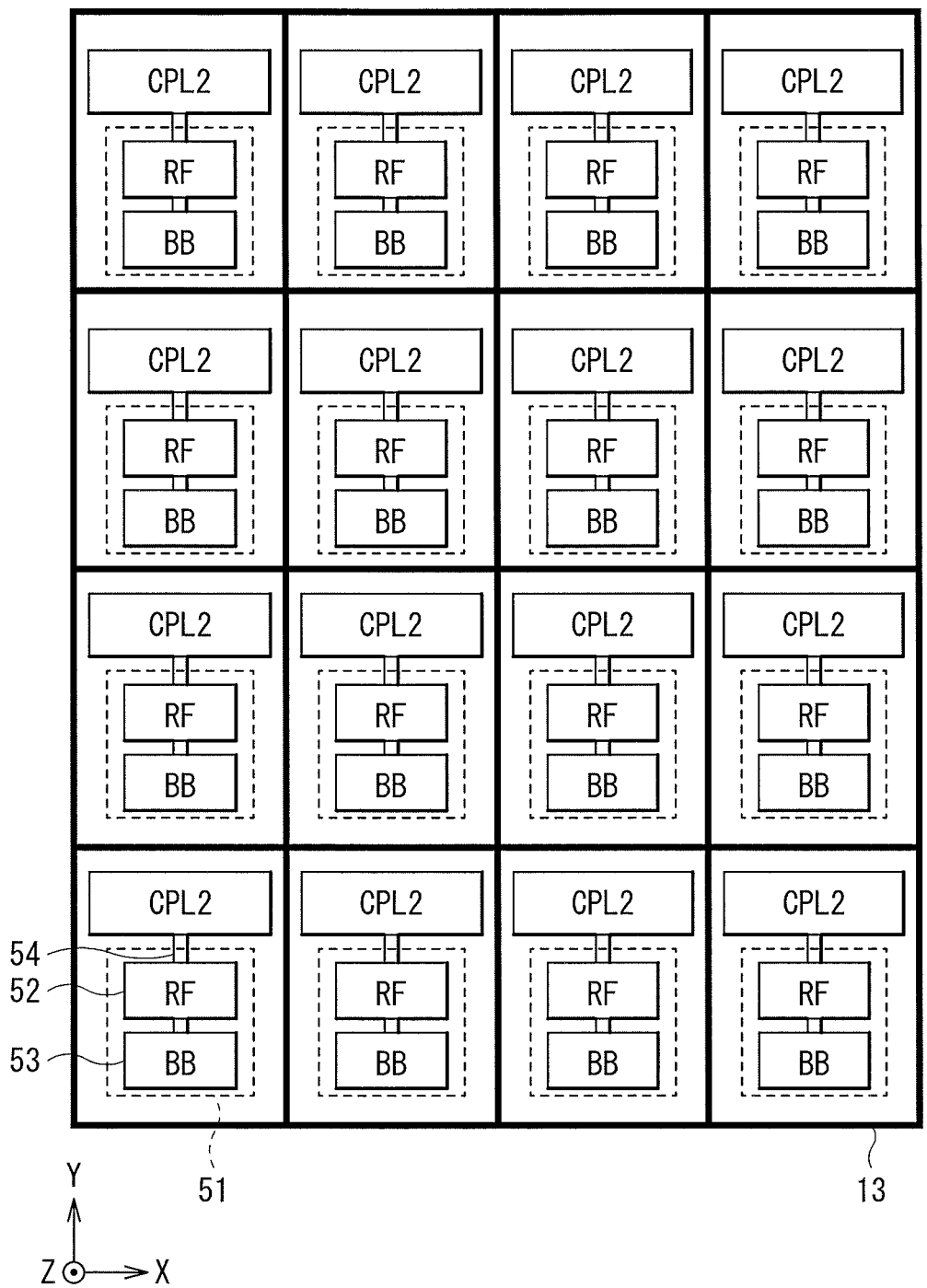
FIG. 2 is a plan view schematically illustrating a configuration example of an active surface of the on-chip antenna according to one example embodiment.
Figure 3:
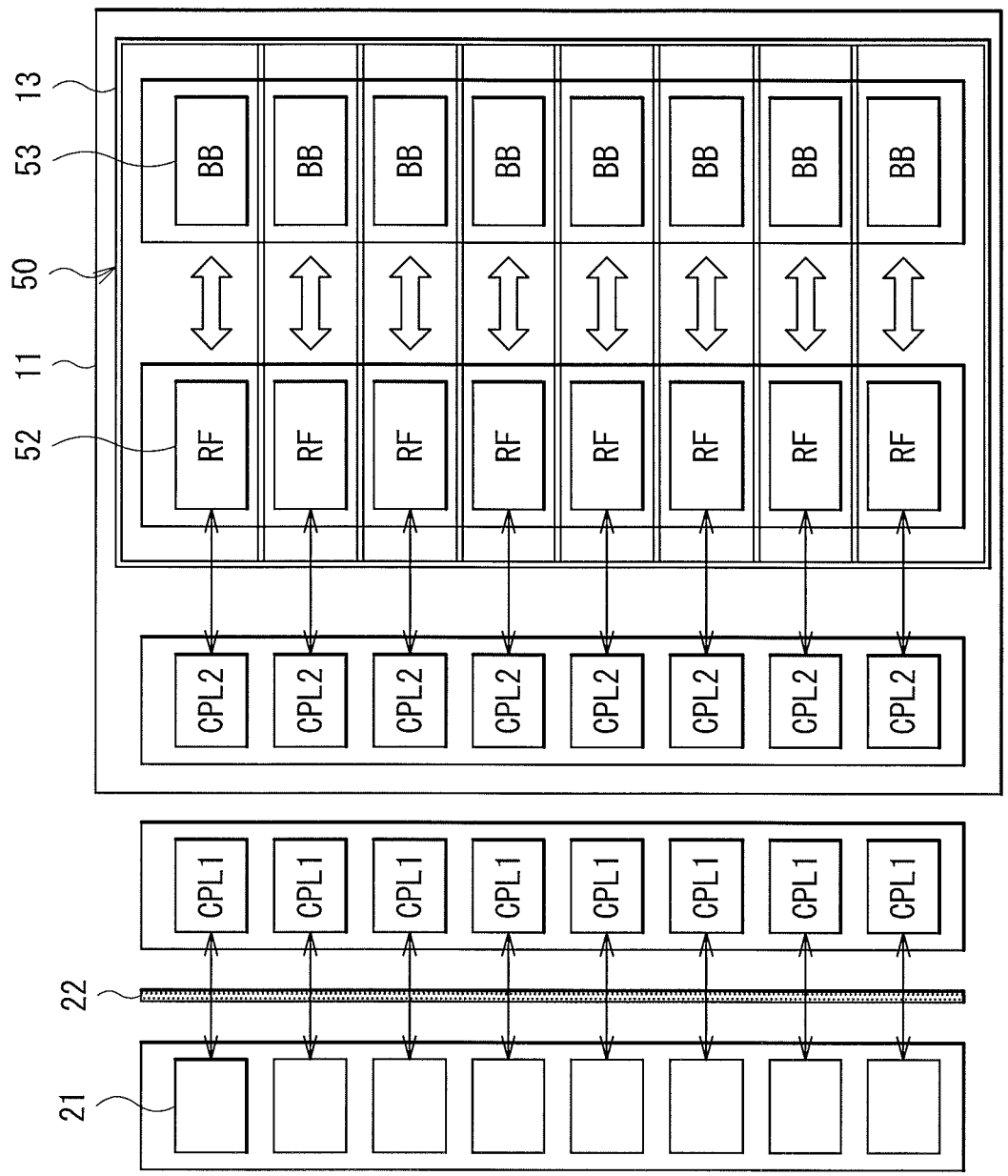
FIG. 3 is a configuration diagram schematically illustrating an operational coupling relationship between sections in the on-chip antenna according to one example embodiment.

FIG. 2 schematically illustrates an example of a planar configuration of the active surface 11 in the on-chip antenna 1. FIG. 3 schematically illustrates operational coupling relationships of the respective sections in the on-chip antenna 1. It is to be noted that although FIG. 2 schematically illustrates an example of a planar configuration corresponding to the XY plane illustrated in FIG. 1, the scale of each section, such as a width of a reference conductor 13 to be described later, is different from FIG. 1, for the sake of description.

In the integrated circuit chip 10, the active surface 11 may be a location where a dynamic effect, such as signal processing, occurs.

The on-chip antenna 1 includes at least one second coupler CPL2 provided on the active surface 11 of the integrated circuit chip 10, and a reference conductor 13 that is provided on the active surface 11 and is configured to be coupled to a reference potential. The reference potential may be a ground potential or a predetermined reference potential. The reference conductors 13 may be, in the cross section illustrated in FIG. 1, for example, disposed between any adjacent second couplers CPL2 out of the plurality of second couplers CPL2. The reference conductors 13 may also be disposed on the active surface 11 at a position corresponding to an outer side of a second coupler CPL2, i.e., at a side of a side surface of the integrated circuit chip 10. The reference conductor 13 disposed between any adjacent second couplers CPL2 and the reference conductor 13 disposed on the outer side of a second coupler CPL2 may be one conductor pattern joined together as a whole, as illustrated in FIG. 2.

The second coupler CPL2 may be provided correspondingly to the first coupler CPL1. The first coupler CPL1 and the second coupler CPL2 may each be, for example, a proximity wireless coupler including a conductive pattern. The second coupler CPL2 is opposed to the first coupler CPL1 and in non-contact with the first coupler CPL1, and may electromagnetically contactlessly coupled to the first coupler CPL1. In one example embodiment, the first coupler CPL1 and the second coupler CPL2 are disposed at positions that completely oppose each other. However, in an alternative example embodiment, the first coupler CPL1 and the second coupler CPL2 may be disposed at positions that partially oppose each other to the extent that the first coupler CPL1 and the second coupler CPL2 are able to be electromagnetically contactlessly coupled to each other.

Further, the integrated circuit chip 10 includes a semiconductor circuit 50 (FIG. 3) that is provided on the active surface 11 and is electrically conductive to the second coupler CPL2.

The semiconductor circuit 50 may have a signal processing circuit 51 coupled to the second coupler CPL2 through a wiring line 54 on the active surface 11 (FIG. 2).

The signal processing circuit 51 may include an RF (high frequency) circuit 52 and a BB (baseband) signal processing circuit 53 (FIGS. 2 and 3). Note that, in FIGS. 2 and 3, the RF circuit 52 and the BB signal processing circuit 53 are simply referred to as "RF" and "BB", respectively.

As illustrated in FIG. 3, in the on-chip antenna 1, for example, the plurality of patch antenna elements 21, the plurality of first couplers CPL1, and the plurality of second couplers CPL2 each may be arrayed. The RF circuits 52 and the BB signal processing circuits 53 may be respectively provided to the plurality of second couplers CPL2.

[Transmission Operation of On-Chip Antenna 1]

A high-frequency transmission signal generated and amplified by the RF circuit 52 and the BB signal processing circuit 53 provided on the active surface 11 may be transmitted to the second coupler CPL2. Further, the high-frequency transmission signal may be transmitted to the patch antenna element 21 through the first coupler CPL1 and the through via 41 owing to electromagnetic field coupling formed by the second coupler CPL2 provided on the active surface 11 and the first coupler CPL1 provided on the back surface 12. The high-frequency transmission signal may be emitted to the upper space by the patch antenna configured by the patch antenna element 21 and the reflective conductor 22.

[Receiving Operation of On-Chip Antenna 1]

A high-frequency reception signal received from the upper space by the patch antenna configured by the patch antenna element 21 and the reflective conductors 22 may be transmitted to the second coupler CPL2 on the active surface 11 owing to the electromagnetic field coupling formed by the second coupler CPL2 provided on the active surface 11 and the first coupler CPL1 provided on the back surface 12. Further, the high-frequency reception signal may be transmitted from the second coupler CPL2 to the RF circuit 52 on the active surface 11, and may be received and processed by the RF circuit 52 and the BB signal processing circuit 53.

[Example Effects of On-Chip Antenna 1]

According to the on-chip antenna 1 in the first example embodiment, as compared with a case where the electric power is supplied by coupling the first coupler CPL1 and the second coupler CPL2 through the through silicon via, it is possible to suppress a conductor loss attributed to the through silicon via. In addition, with the on-chip antenna 1 according to the first example embodiment, it is possible to reduce a cost without using the through silicon via for supplying electric power to the patch antenna element 21.

1.2 Example of Coupling of On-Chip Antenna to Printed Circuit Board

Figure 4:
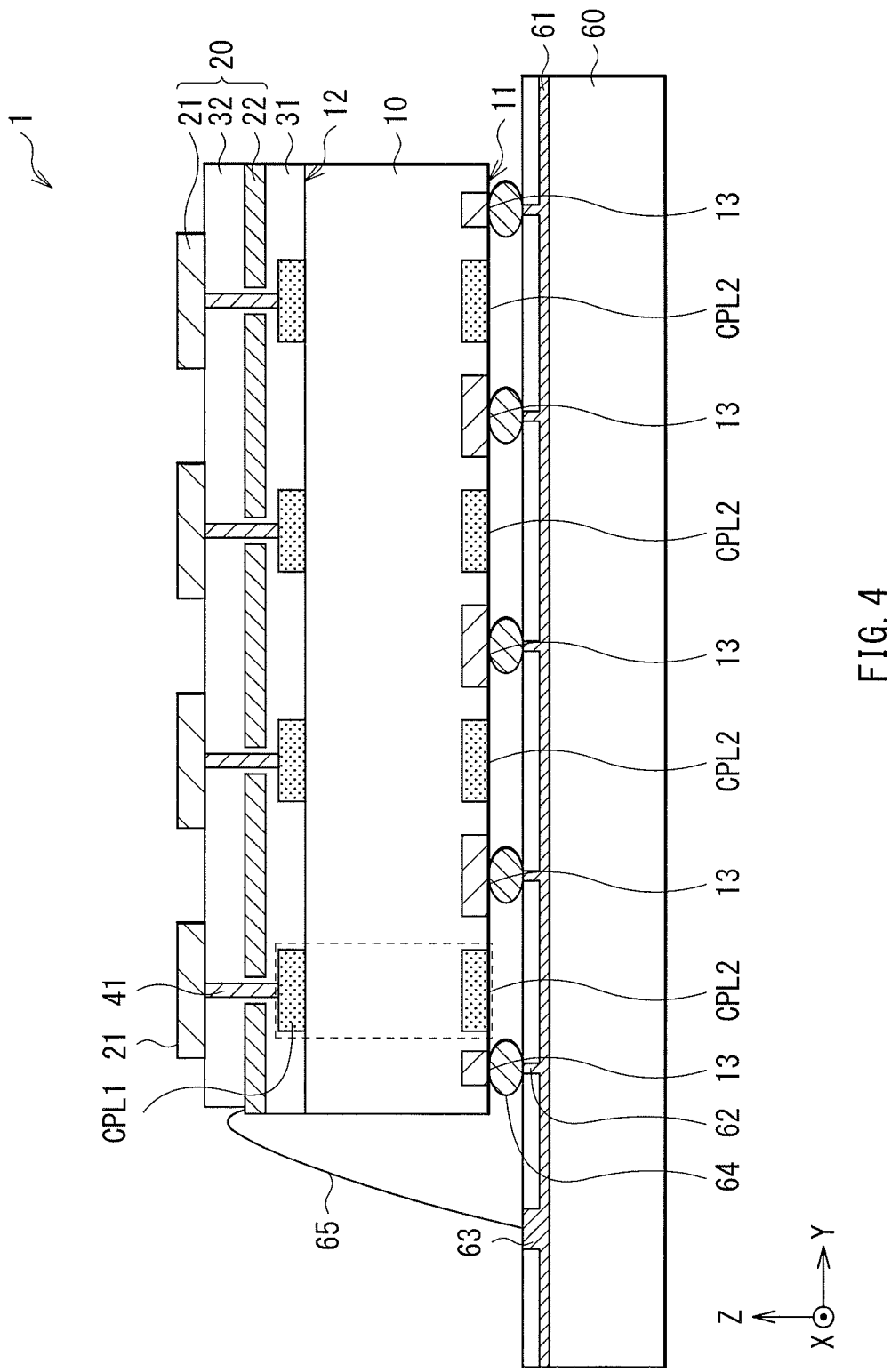
FIG. 4 is a cross-sectional view of a configuration example in which the on-chip antenna according to one example embodiment is coupled to a printed circuit board.

FIG. 4 illustrates a configuration example in which the on-chip antenna 1 according to the first example embodiment is coupled to a printed circuit board 60.

The on-chip antenna 1 may be mounted on the printed circuit board 60 to allow the active surface 11 of the integrated circuit chip 10 to oppose an upper surface side of the printed circuit board 60. The on-chip antenna 1 and the printed circuit board 60 may be joined by a solder ball 64. The solder ball 64 may be provided at least at a position corresponding to an interval between adjacent second couplers CPL2 out of the plurality of second couplers CPL2. Further, the solder ball 64 may also be provided at a position corresponding to an outer side of the second coupler CPL2, i.e., at a side of a side surface of the integrated circuit chip 10.

The printed circuit board 60 may include a ground layer 61 and a plurality of through vias 62 each coupled to the ground layer 61 and each passing through the printed circuit board 60 to an upper side of the printed circuit board 60. In an illustrated example, the solder ball 64 may include a plurality of solder balls 64, and the plurality of through vias 62 may also be provided at least at positions corresponding to the positions where the solder balls 64 are provided. Further, the through vias 62 may also be provided in a region outside the position that is opposed to the active surface 11.

The reflective conductor 22 of the on-chip antenna 1 may be coupled to the ground layer 61 of the printed circuit board 60 through a wire bond 65 and a through via 63. A first end of the wire bond 65 may be coupled to the reflective conductor 22. A second end of the wire bond 65 may be coupled to, for example, a through via 63 provided in a region outside the position opposing the active surface 11. With this configuration, a ground potential may be applied to the reflective conductor 22.

The solder balls 64 may each be disposed to be in contact with at least the reference conductor 13 provided on the active surface 11 of the integrated circuit chip 10 and any of the through vias 62 provided on the printed circuit board 60. Accordingly, the reference conductor 13 may be coupled to the ground layer 61 of the printed circuit board 60 through the solder ball 64 and the through via 62, and the ground potential may be applied thereto.

1.3 Modification Examples of First Example Embodiment

First Modification Example

Figure 5:
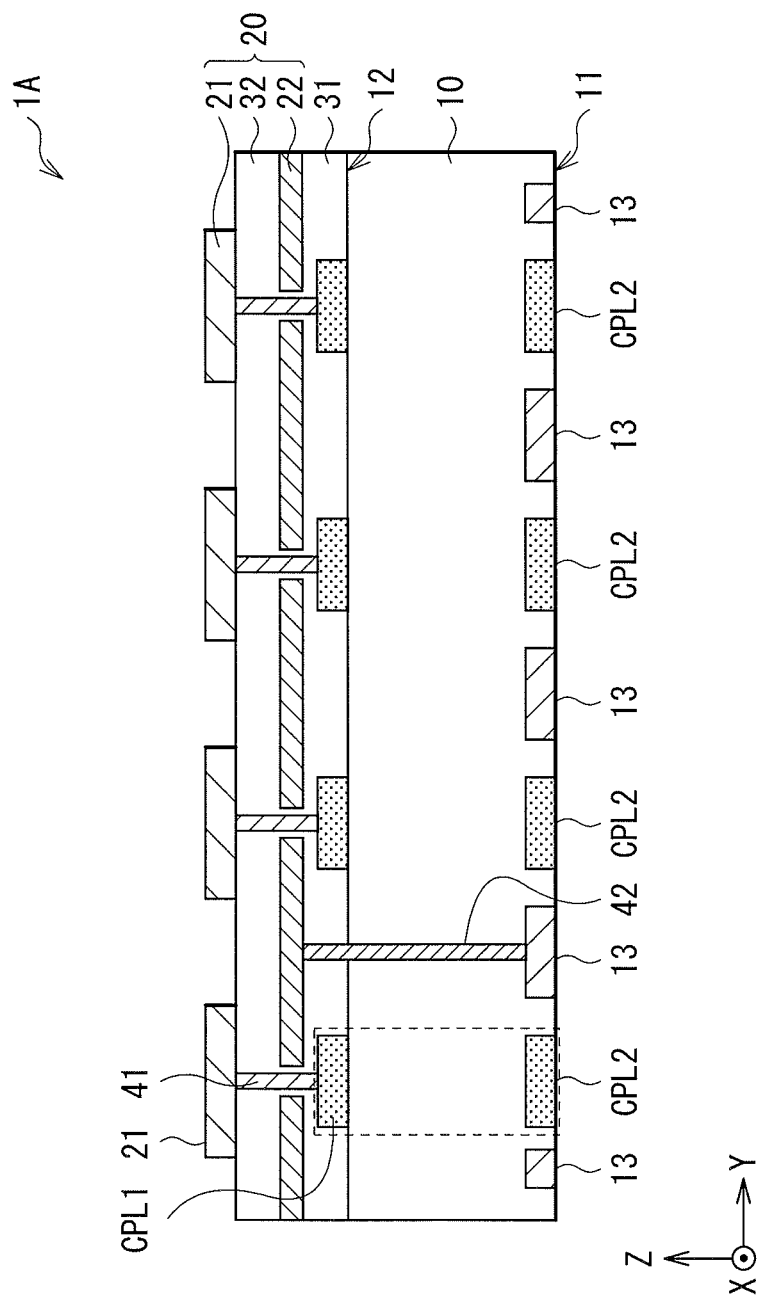
FIG. 5 is a cross-sectional view of a configuration example of an on-chip antenna according to a first modification example of one example embodiment.

FIG. 5 illustrates an example of a cross-sectional configuration of an on-chip antenna 1A according to a first modification example of the first example embodiment.

The on-chip antenna 1A according to the first modification example may further include one through via 42 that couples the reflective conductor 22 and the reference conductor 13, in addition to the configuration of the on-chip antenna 1 illustrated in FIG. 1.

The through via 42 may pass through the integrated circuit chip 10 and the first dielectric layer 31, and a first end of the through via 42 may be coupled to a reference conductor 13 at any position. A second end of the through via 42 may be coupled to the reflective conductor 22 at a position opposed to the reference conductor 13 at a position where the first end of the through via 42 is coupled. With this configuration, the reflective conductor 22 and the reference conductor 13 may be electrically conductive to each other through the through via 42.

According to the on-chip antenna 1A of the first modification example, the reflective conductor 22 and the reference conductor 13 are coupled to each other at the shortest distance, thereby improving antenna characteristics.

Other configurations and operations are substantially the same as those of the on-chip antenna 1 according to the first example embodiment.

Second Modification Example

Figure 6:
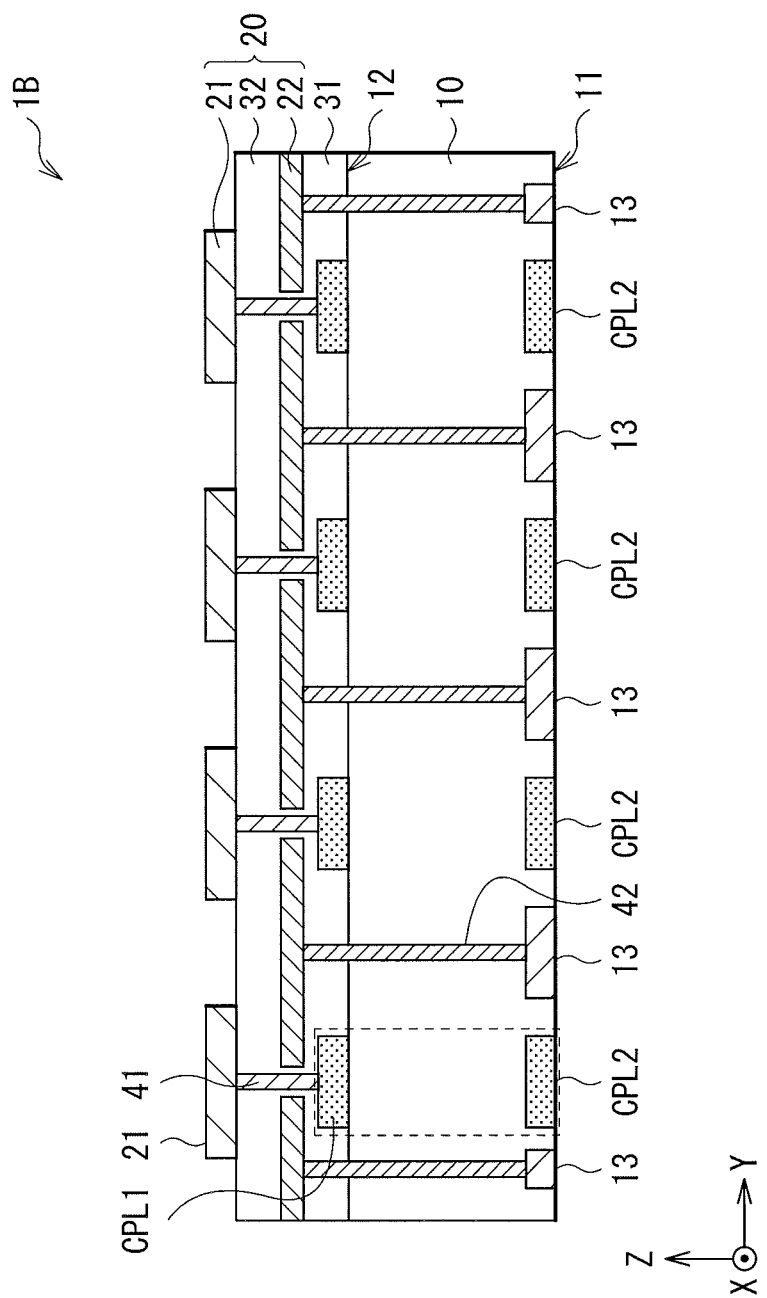
FIG. 6 is a cross-sectional view of a configuration example of an on-chip antenna according to a second modification example of one example embodiment.

FIG. 6 illustrates an example of a cross-sectional configuration of an on-chip antenna 1B according to a second modification example of the first example embodiment.

The on-chip antenna 1B according to the second modification example may include the plurality of through vias 42 that each couple the reflective conductor 22 and the reference conductor 13, rather than one through via 42, as compared with the configuration of the on-chip antenna 1A according to the first modification example illustrated in FIG. 5.

As described above, the reference conductor 13 may be, in the cross section illustrated in FIG. 1, for example, disposed between any adjacent second couplers CPL2 out of the plurality of second couplers CPL2. The reference conductors 13 may also be disposed on the active surface 11 at a position corresponding to an outer side of the second coupler CPL2, i.e., at a side of a side surface of the integrated circuit chip 10.

In the on-chip antenna 1B according to the second modification example, the through vias 42 may each pass between adjacent first couplers CPL1 out of the plurality of first couplers CPL1, and may each be coupled to a reference conductor 13 provided between adjacent second couplers CPL2 out of the plurality of second couplers CPL2. The through vias 42 may also be each provided at a position corresponding to the outer side of the second coupler CPL2.

According to the on-chip antenna 1B of the second modification example, because the through vias 42 are provided, each of which passes between the adjacent first couplers CPL1 and is coupled to the reference conductor 13 provided between the adjacent second couplers CPL2, a shielding effect owing to the through vias 42 enhances the isolation between the adjacent patch antennas and improves the antenna characteristics.

Other configurations and operations are substantially the same as those of the on-chip antenna 1 according to the first example embodiment or the on-chip antenna 1A according to the first modification example.

Third Modification Example

Figure 7:
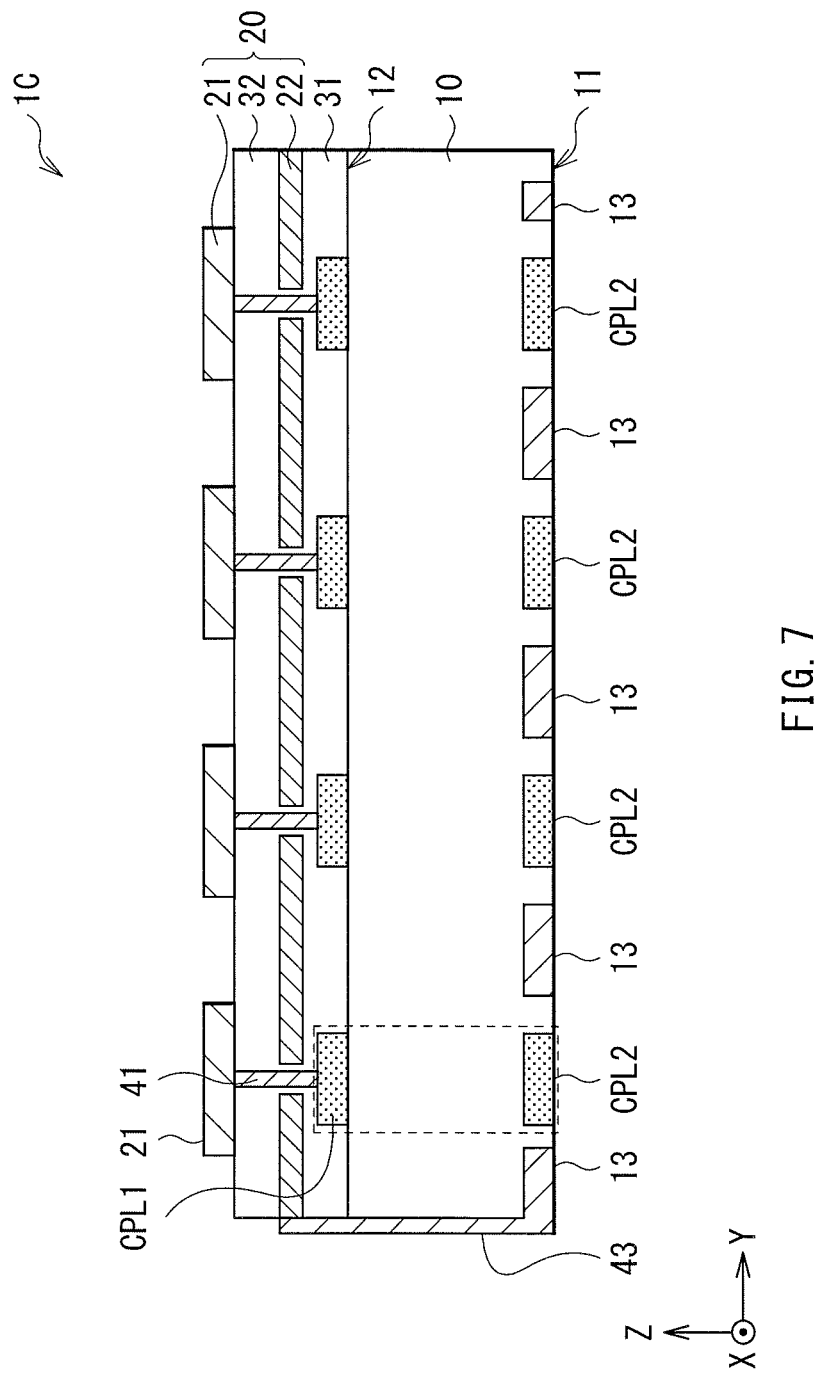
FIG. 7 is a cross-sectional view of a configuration example of an on-chip antenna according to a third modification example of one example embodiment.

FIG. 7 illustrates an example of a cross-sectional configuration of an on-chip antenna 1C according to a third modification example of the first example embodiment.

The on-chip antenna 1C according to the third modification example may further include a side electrode 43 in addition to the configuration of the on-chip antenna 1 illustrated in FIG. 1.

The side electrode 43 may be provided on side surfaces of the integrated circuit chip 10, the first dielectric layer 31, and the reflective conductor 22. A first end of the side electrode 43 may be coupled to the reference conductor 13 provided in the vicinity of the side surface of the integrated circuit chip 10. A second end of the side electrode 43 may be coupled to the side surface of the reflective conductor 22. With this configuration, the reflective conductor 22 and the reference conductor 13 may be electrically conductive to each other through the side electrode 43.

Other configurations and operations are substantially the same as those of the on-chip antenna 1 according to the first example embodiment.

Other Modification Examples of First Example Embodiment

The on-chip antenna according to any modification example of the first example embodiment may be mounted on the printed circuit board 60 (FIG. 4) in the similar manner to the on-chip antenna 1 according to the first example embodiment. In those modification examples, the wire bond 65 illustrated in FIG. 4 may be omitted.

2. Second Example Embodiment

Next, an on-chip antenna according to a second example embodiment of the disclosure will be described. It is to be noted that, in the following description, the same reference numerals are given to substantially the same components as those of the on-chip antenna according to the first example embodiment, and description thereof will be omitted as appropriate.

2.1 Description of On-Chip Antenna According to Second Example Embodiment

Figure 8:
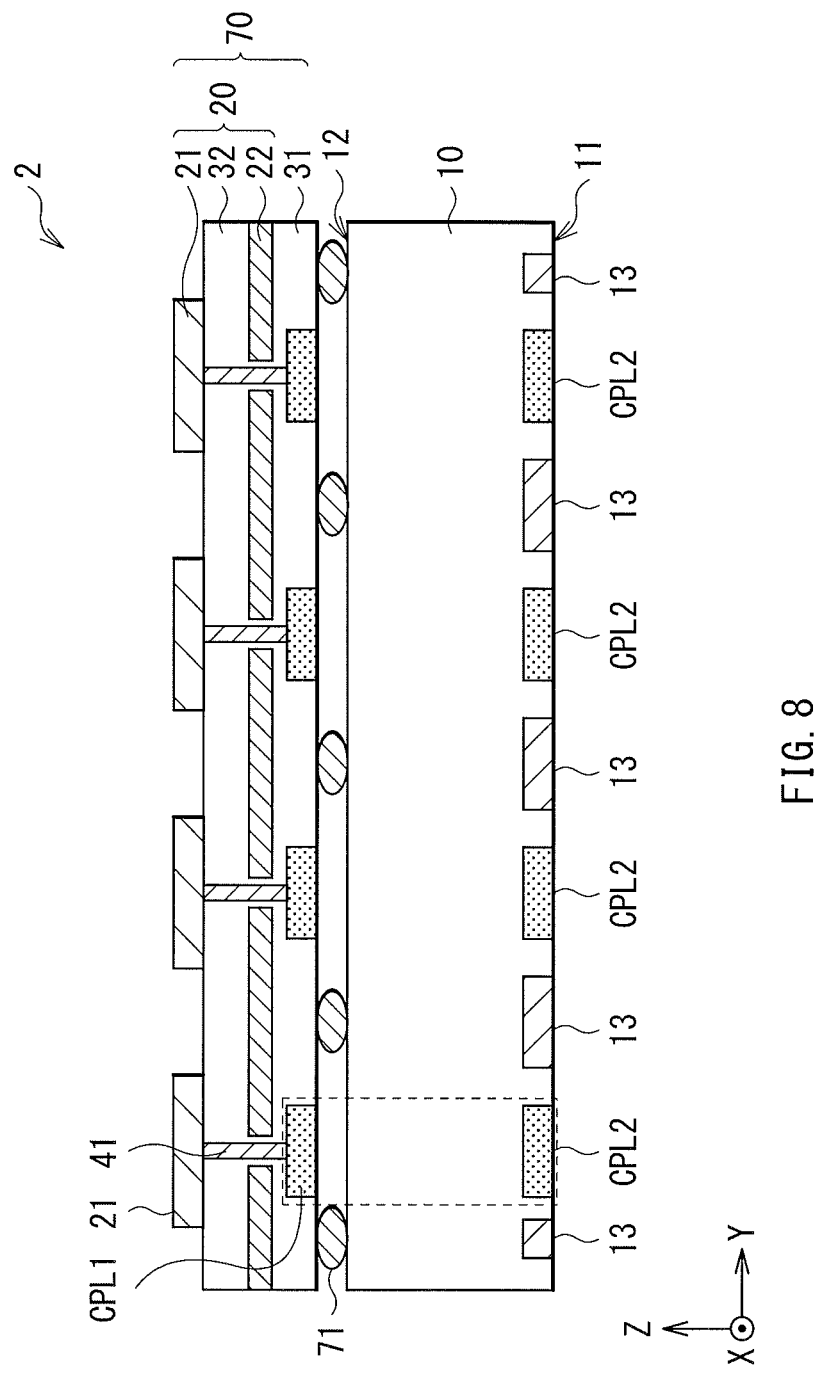
FIG. 8 is a cross-sectional view of a configuration example of an on-chip antenna according to one example embodiment.

FIG. 8 illustrates an example of a cross-sectional configuration of the on-chip antenna 2 according to the second example embodiment of the disclosure.

The on-chip antenna 2 according to the second example embodiment may include, in addition to the configuration of the on-chip antenna 1 according to the first example embodiment, a joining member 71 and an antenna module 70, the antenna module 70 being joined, by the joining member 71, to the integrated circuit chip 10.

The antenna module 70 may include the patch antenna element 21, the reflective conductor 22, the first coupler CPL1, the first dielectric layer 31, and the second dielectric layer 32. The configuration of each section of the antenna module 70 may be substantially the same as the configuration of the on-chip antenna 1 according to the first example embodiment except that the antenna module 70 is joined, by the joining member 71, to the integrated circuit chip 10.

The antenna module 70 may be opposed to the back surface 12 of the integrated circuit chip 10 and separated away from the back surface 12. The antenna module 70 may be joined, by the joining member 71, to the back surface 12 of the integrated circuit chip 10.

In an illustrated example, the joining member 71 may include a plurality of joining members 71 to join the antenna module 70 and the integrated circuit chip 10 at a plurality of positions that are different from the positions of the first couplers CPL1. The joining member 71 may include, for example, an adhesive material having no or sufficiently no electric conductivity. The joining members 71 may each include, however, an adhesive material having electric conductivity.

According to the on-chip antenna 2 of the second example embodiment, the integrated circuit chip 10 and the antenna module 70 are manufacturable in different process steps and by different manufacturing methods. A loss of the expensive integrated circuit chip 10 may be prevented by joining the high-quality integrated circuit chip 10 and the high-quality antenna module 70 manufactured by different processes and different methods.

Other configurations and operations are substantially the same as those of the on-chip antenna 1 according to the first example embodiment.

2.2 Modification Examples of Second Example Embodiment

Figure 9:
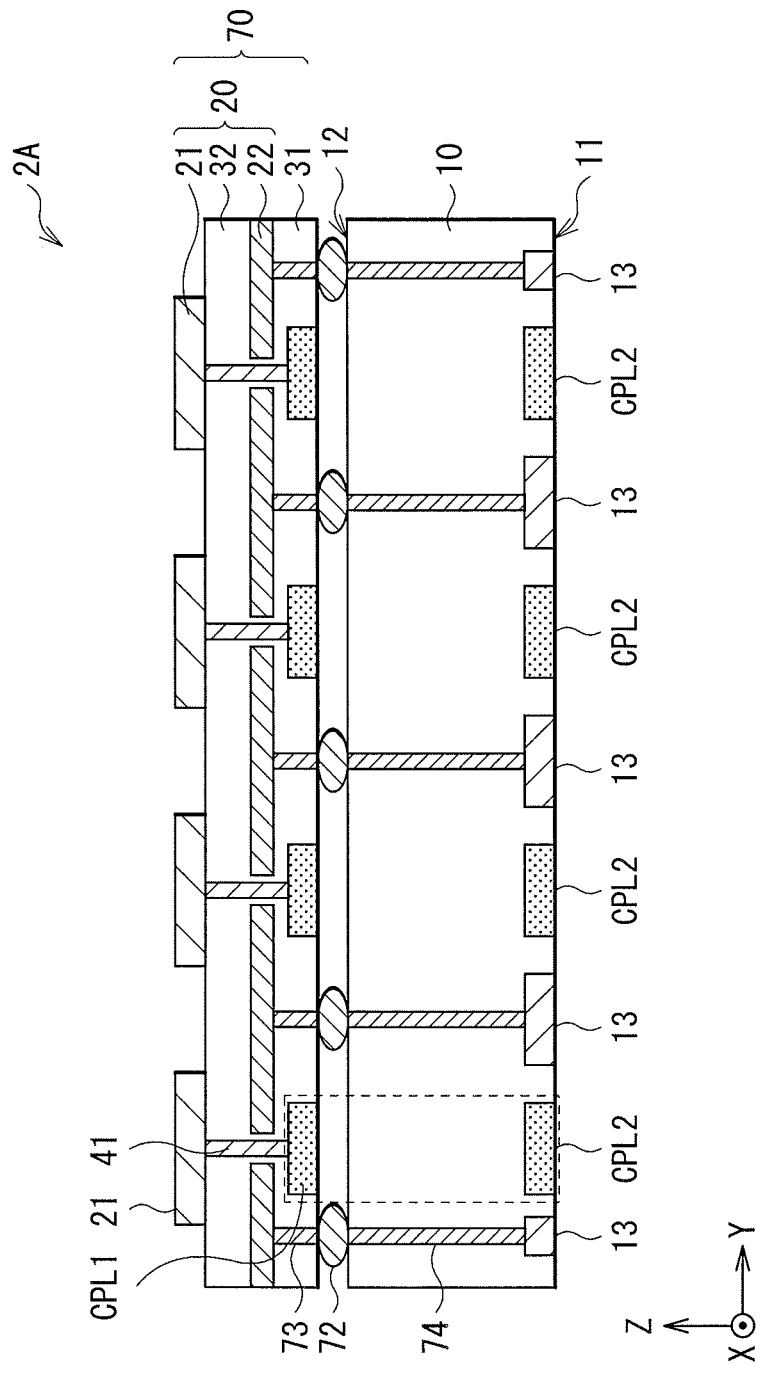
FIG. 9 is a cross-sectional view of a configuration example of an on-chip antenna according to a modification example of one example embodiment.

FIG. 9 illustrates an example of a cross-sectional configuration of an on-chip antenna 2A according to a modification example of the second example embodiment.

The on-chip antenna 2A may further include, in addition to the configuration of the on-chip antenna 2 according to the second example embodiment, a through via 73 and a through silicon via 74 that couples the reflective conductor 22 and the reference conductor 13 to each other.

Moreover, the on-chip antenna 2A may include a solder ball 72 instead of the joining member 71. In one embodiment of the disclosure, the solder ball 72 corresponds to a specific but non-limiting example of a "joining member". The solder ball 72 may include an electrically conductive material.

In one embodiment of the disclosure, the through via 73 corresponds to a specific but non-limiting example of a "first through via". In one embodiment of the disclosure, the through silicon via 74 corresponds to a specific but non-limiting example of a "second through via".

The through via 73 may be provided in the antenna module 70, may pass through a first dielectric layer 31, and may have a first end coupled to the reflective conductor 22. The through via 73 may be provided at least between adjacent first couplers CPL1 out of the plurality of first couplers CPL1. Further, the through via 73 may be provided at a position corresponding to an outer side of the first coupler CPL1, i.e., at a side of a side surface of the first dielectric layer 31.

The through silicon via 74 may be provided in the integrated circuit chip 10, and a first end of the through silicon via 74 may be coupled at least to the reference conductor 13 provided between adjacent second couplers CPL2 out of the plurality of second couplers CPL2. Further, the through silicon via 74 may be provided at a position corresponding to an outer side of the second coupler CPL2 i.e., at a side of a side surface of the integrated circuit chip 10.

In the on-chip antenna 2A, a second end of the through via 73 and a second end of the through silicon via 74 may be coupled to the solder ball 72, which allows the reflective conductor 22 and the reference conductor 13 to be electrically conductive to each other through the through via 73, the solder ball 72, and the through silicon via 74.

According to the on-chip antenna 2A, because at least the through via 73 passing between the adjacent first couplers CPL1 and the through silicon via 74 coupled to the reference conductor 13 provided between the adjacent second couplers CPL2 are provided, the shielding effect owing to the through via 73 and the through silicon via 74 enhances the isolation between the adjacent patch antennas and improves the antenna characteristics.

Other configurations and operations are substantially similar those of the on-chip antenna 2 according to the second example embodiment.

Other Modification Examples of Second Example Embodiment

The on-chip antenna 2 according to the second example embodiment and the on-chip antenna 2A according to the modification example thereof may be mounted on the printed circuit board 60 (FIG. 4) in the similar manner as the on-chip antenna 1 according to the first example embodiment. In a case where the on-chip antenna 2A is mounted on the printed circuit board 60, the wire bond 65 illustrated in FIG. 4 may be omitted.

Moreover, the disclosure encompasses any possible combination of some or all of the various embodiments and the modification examples described herein and incorporated herein.

It is possible to achieve at least the following configurations from the above-described example embodiments of the disclosure.

(1)
An on-chip antenna including:
an integrated circuit chip that includes a semiconductor, has an active surface and a back surface that are opposed to each other, and has a semiconductor circuit provided on the active surface;
a reflective conductor disposed above the back surface, where the active surface is directed downward and the back surface is directed upward;
at least one first coupler disposed between the back surface and the reflective conductor;
at least one patch antenna element disposed above the reflective conductor;
a connection that couples the at least one patch antenna element and the at least one first coupler; and
at least one second coupler that is provided on the active surface to be electrically conductive to the semiconductor circuit, and is opposed to the at least one first coupler and in non-contact with the at least one first coupler.

(2)
The on-chip antenna according to (1), further including a first dielectric layer disposed between the back surface and the reflective conductor.

(3)
The on-chip antenna according to (2), further including a second dielectric layer disposed between the reflective conductor and the at least one patch antenna element.

(4)
The on-chip antenna according to any one of (1) to (3), further including a reference conductor that is provided on the active surface and is configured to be coupled to a reference potential.

(5)
The on-chip antenna according to (4), further including a through via that couples the reflective conductor and the reference conductor.

(6)
The on-chip antenna according to (5), in which
the at least one patch antenna element includes a plurality of patch antenna elements, the at least one first coupler includes a plurality of first couplers, and the at least one second coupler includes a plurality of second couplers, the reference conductor is provided, on the active surface, at least between adjacent second couplers out of the plurality of second couplers, and the through via passes between adjacent first couplers out of the plurality of first couplers and is coupled to the reference conductor provided between the adjacent second couplers out of the plurality of second couplers.

(7)
The on-chip antenna according to (3), further including a joining member, in which the at least one patch antenna element, the reflective conductor, the at least one first coupler, the first dielectric layer, and the second dielectric layer configure an antenna module, and the antenna module is opposed to the back surface and separated away from the back surface, and is joined, by the joining member, to the back surface of the integrated circuit chip.

(8)
The on-chip antenna according to (7), further including:

a reference conductor that is provided on the active surface and is configured to be coupled to a reference potential;

a first through via that is provided in the antenna module, passes through the first dielectric layer, and has a first end coupled to the reflective conductor; and a second through via that is provided in the integrated circuit chip, and has a first end coupled to the reference conductor, in which the joining member includes an electrically conductive material, and a second end of the first through via and a second end of the second through via are coupled to the joining member to cause the reflective conductor and the reference conductor to be electrically conductive to each other.

According to the on-chip antenna in an embodiment of the disclosure, because the first coupler and the second coupler are opposed to each other and are in non-contact with each other, it is possible to suppress a conductor loss attributed to the through silicon via.

Although the disclosure has been described in terms of exemplary embodiments, it is not limited thereto. It should be appreciated that variations may be made in the described embodiments by persons skilled in the art without departing from the scope of the disclosure as defined by the following claims. The limitations in the claims are to be interpreted broadly based on the language employed in the claims and not limited to examples described in this specification or during the prosecution of the application, and the examples are to be construed as non-exclusive. For example, in this disclosure, the term "preferably", "preferred" or the like is non-exclusive and means "preferably", but not limited to. The use of the terms first, second, etc. do not denote any order or importance, but rather the terms first, second, etc. are used to distinguish one element from another. The term "substantially" and its variations are defined as being largely but not necessarily wholly what is specified as understood by one of ordinary skill in the art. The term "about" as used herein can allow for a degree of variability in a value or range. The term "disposed above/provided above/formed above" and its variants as used herein refer to elements disposed directly in contact with each other or indirectly by having intervening structures therebetween. The term "disposed on/provided on/formed on" and its variants as used herein refer to elements disposed directly in contact with each other or indirectly by having intervening structures therebetween. Moreover, no element or component in this disclosure is intended to be dedicated to the public regardless of whether the element or component is explicitly recited in the following claims.

What is claimed is:

1. An on-chip antenna comprising:
   an integrated circuit chip that includes a semiconductor, has an active surface and a back surface that are opposed to each other, and has a semiconductor circuit provided on the active surface;
   a reflective conductor disposed above the back surface, where the active surface is directed downward and the back surface is directed upward;
   at least one first coupler disposed between the back surface and the reflective conductor;
   at least one patch antenna element disposed above the reflective conductor;
   a connection that couples the at least one patch antenna element and the at least one first coupler; and
   at least one second coupler that is provided on the active surface to be electrically conductive to the semiconductor circuit, and is opposed to the at least one first coupler and in non-contact with the at least one first coupler.

2. The on-chip antenna according to claim 1, further comprising a first dielectric layer disposed between the back surface and the reflective conductor.

3. The on-chip antenna according to claim 2, further comprising a second dielectric layer disposed between the reflective conductor and the at least one patch antenna element.

4. The on-chip antenna according to claim 3, further comprising a joining member, wherein
   the at least one patch antenna element, the reflective conductor, the at least one first coupler, the first dielectric layer, and the second dielectric layer configure an antenna module, and
   the antenna module is opposed to the back surface and separated away from the back surface, and is joined, by the joining member, to the back surface of the integrated circuit chip.

5. The on-chip antenna according to claim 4, further comprising:
   a reference conductor that is provided on the active surface and is configured to be coupled to a reference potential;
   a first through via that is provided in the antenna module, passes through the first dielectric layer, and has a first end coupled to the reflective conductor; and
   a second through via that is provided in the integrated circuit chip, and has a first end coupled to the reference conductor, wherein
   the joining member includes an electrically conductive material, and
   a second end of the first through via and a second end of the second through via are coupled to the joining member to cause the reflective conductor and the reference conductor to be electrically conductive to each other.

6. The on-chip antenna according to claim 1, further comprising a reference conductor that is provided on the active surface and is configured to be coupled to a reference potential.

7. The on-chip antenna according to claim 6, further comprising a through via that couples the reflective conductor and the reference conductor.

8. The on-chip antenna according to claim 7, wherein
the at least one patch antenna element comprises a plurality of patch antenna elements, the at least one first coupler comprises a plurality of first couplers, and the at least one second coupler comprises a plurality of second couplers, the reference conductor is provided, on the active surface, at least between adjacent second couplers out of the plurality of second couplers, and the through via passes between adjacent first couplers out of the plurality of first couplers and is coupled to the reference conductor provided between the adjacent second couplers out of the plurality of second couplers.

* * * * *